(12) United States Patent
Gudan et al.

(10) Patent No.: US 9,618,552 B2
(45) Date of Patent: Apr. 11, 2017

(54) METHOD AND APPARATUS FOR MEASURING RADIO-FREQUENCY ENERGY

(75) Inventors: Ken Gudan, Sunnyvale, CA (US); Sergey Chemishkian, Menlo Park, CA (US); Matthew S. Reynolds, Durham, NC (US)

(73) Assignees: RICOH CO., LTD., Tokyo (JP); DUKE UNIVERSITY, Durham, NC (US)

( * ) Notice: Subject to any disclaimer, the term of this patent is extended or adjusted under 35 U.S.C. 154(b) by 1321 days.

(21) Appl. No.: 13/415,555

(22) Filed: Mar. 8, 2012

(65) Prior Publication Data

US 2013/0238265 A1    Sep. 12, 2013

(51) Int. Cl.
| | |
|---|---|
| *H04J 1/16* | (2006.01) |
| *G01R 29/08* | (2006.01) |
| *H04B 17/23* | (2015.01) |
| *H04B 17/318* | (2015.01) |

(52) U.S. Cl.
CPC ......... *G01R 29/0871* (2013.01); *H04B 17/23* (2015.01); *H04B 17/318* (2015.01)

(58) Field of Classification Search
USPC ....................................................... 370/252
See application file for complete search history.

(56) References Cited

U.S. PATENT DOCUMENTS

| | | | |
|---|---|---|---|
| 7,049,805 B2 | 5/2006 | Rose et al. | |
| 7,084,605 B2 | 8/2006 | Mickle et al. | |
| 9,176,176 B2 | 11/2015 | Dembo et al. | |
| 2002/0167445 A1 | 11/2002 | Eden | |
| 2011/0175594 A1 | 7/2011 | Funato et al. | |
| 2012/0032518 A1* | 2/2012 | Huang ..................... | H02J 1/10 307/81 |

FOREIGN PATENT DOCUMENTS

| | | |
|---|---|---|
| FR | 2 829 638 A1 | 3/2003 |
| JP | 2005517963 | 6/2005 |
| JP | 2007517483 | 6/2007 |

(Continued)

OTHER PUBLICATIONS

Chandrakasan, A. P., et al., "Low-Power Impulse UWB Architectures and Circuits", Proceedings of the IEEE, New York, United States, vol. 97, No. 2, Feb. 1, 2009, pp. 332-352, XP011253729, ISSN: 0018-9219.

(Continued)

*Primary Examiner* — Zewdu A Beyen
(74) *Attorney, Agent, or Firm* — Blakely, Sokoloff, Taylor & Zafman LLP (57) ABSTRACT

A method and apparatus is disclosed herein for measuring radio-frequency energy. In one embodiment, the apparatus comprises one or more antennas, a wideband radio frequency detector (e.g., a logarithmic amplifier (LogAmp)) coupled to the one or more antennas to measure ambient RF energy, wherein the wideband radio frequency detector has an analog output indicative of RF input power received by the one or more antennas, and an analog-to-digital converter coupled to the wideband radio frequency detector to convert the analog output to a digital value, the digital value being applied to a calibration function, to provide a number representing RF energy.

16 Claims, 5 Drawing Sheets

(56) References Cited

FOREIGN PATENT DOCUMENTS

| JP | 2008145426 | 6/2008 |
|----|------------|--------|
| JP | 2011149930 | 8/2011 |
| WO | 03/090376 A1 | 10/2003 |
| WO | 2010/022156 A2 | 2/2010 |

OTHER PUBLICATIONS

Yang, Chin-Lung, et al., "Low-Invasive Implantable Devices of Low-Power Consumption Using High-Efficiency Antennas for Cloud Health Care", IEEE Journal on Emerging and Selected Topics in Circuits and Systems, Piscataway, New Jersey, United States, vol. 2, No. 1, Mar. 1, 2012, pp. 14-23, XP011441044, ISSN: 2156-3357, DOI: 10.1109/JETCAS.2012.2187469.

Dolgov, Arseny, et al., "Power Management System for Online Low Power RF Energy Harvesting Optimization", IEEE Transactions on Circuits and Systems I: Regular Papers, United States, vol. 57, No. 7, Jul. 1, 2010, pp. 1802-1811, XP011333726, ISSN: 1549-8328, DOI: 10.1109/TCSI.2009.2034891.

European Search Report dated Jul. 3, 2013 for European Patent Application No. 13157668.8, 8 pages.

\* cited by examiner

METHOD AND APPARATUS FOR MEASURING RADIO-FREQUENCY ENERGY

FIELD OF THE INVENTION

Embodiments of the present invention relate to the field of RF energy harvesting; more particularly, embodiments of the present invention relate to measuring RF energy that can be harvested based on data from an apparatus including a wideband radio frequency detector such as a logarithmic amplifier (LogAmp) and/or a spectrum analyzer.

BACKGROUND OF THE INVENTION

Radio Frequency Identification (RFID) tags are becoming increasingly common. RFID tags that include sensing capabilities have emerged as a generally inexpensive and effective means of addressing many wireless sensor applications in both indoor and outdoor sensing applications. Purely passive sensors, such as RFID tags, when actively interrogated by an RF transceiver/reader, receive energy to power themselves up so that they can acquire readings from their attached sensing elements. Generally, RFID tags equipped with one or more sensors require a source of energy to measure and store their acquired information at times other than during active interrogation by a reader.

Next generation sensor networks may be powered by energy harvesting techniques to avoid requiring batteries. Energy harvesting is a process by which energy is derived from external sources (e.g., radio frequency energy, solar power, thermal energy, wind energy, salinity gradients, and kinetic energy), captured and stored.

Energy may be harvested from radio frequency signals propagating wirelessly. With RF harvesting, wireless energy comes from a radio frequency transmitting device that is some distance away from a device that harvests energy from the radio frequency transmission.

One of the more popular forms of RF used today is Wi-Fi communications. Today, most Wi-Fi communications are in the 2.4 GHz and 5.8 GHz frequency bands and there are many local area networks that are based on Wi-Fi in which access points enable Wi-Fi clients to gain access to networks such as the Internet. Furthermore, the 2.4 GHz and 5.8 GHz bands also supports other networking standards, such as Zigbee and Bluetooth, and other proprietary networks, each transmitting energy by communicating in this same space. Additionally there are other frequency bands that support different communication protocols, each of which transmit energy when they are communicating.

SUMMARY OF THE INVENTION

A method and apparatus is disclosed herein for measuring radio-frequency energy. In one embodiment, the apparatus comprises one or more antennas, a wideband radio frequency detector (e.g., a logarithmic amplifier (LogAmp)) coupled to the one or more antennas to measure ambient RF energy, wherein the wideband radio frequency detector has an analog output indicative of RF input power received by the one or more antennas, and an analog-to-digital converter coupled to the wideband radio frequency detector to convert the analog output to a digital value, the digital value being applied to a calibration lookup table together with a path loss estimate, to provide a number representing RF energy.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

A method and apparatus for measuring radio-frequency (RF) energy available for RF harvesting are described. In one embodiment, the RF energy is from the 2.4 GHz Wi-Fi frequency band. In some embodiments, RF energy may be harvested from sources other than a WiFi transmission. The measurement apparatus can be used to measure the amount of energy that can be harvested from other RF sources (e.g., Bluetooth, Zigbee, etc.), vibration, etc., and from different RF frequency spectrums as well.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Measurement Apparatus Overview

As discussed above, one embodiment of the measurement apparatus measures all available energy in the 2.4 GHz ISM band (2.4 GHz to 2.5 GHz). Another embodiment of the measurement apparatus measures the available energy in another band, alone or in combination with the 2.4 GHz ISM band. Note that this band includes not only Wi-Fi, but also Zigbee, Bluetooth, other handheld device wireless communications, and even emissions from microwave ovens. Embodiments of the measurement apparatus described herein measure the RF energy from all these devices if they are in the proximity of the measurement apparatus. In alternative embodiments, the RF of other frequency bands is measured to determine the energy available for RF harvesting.

Figure 1:
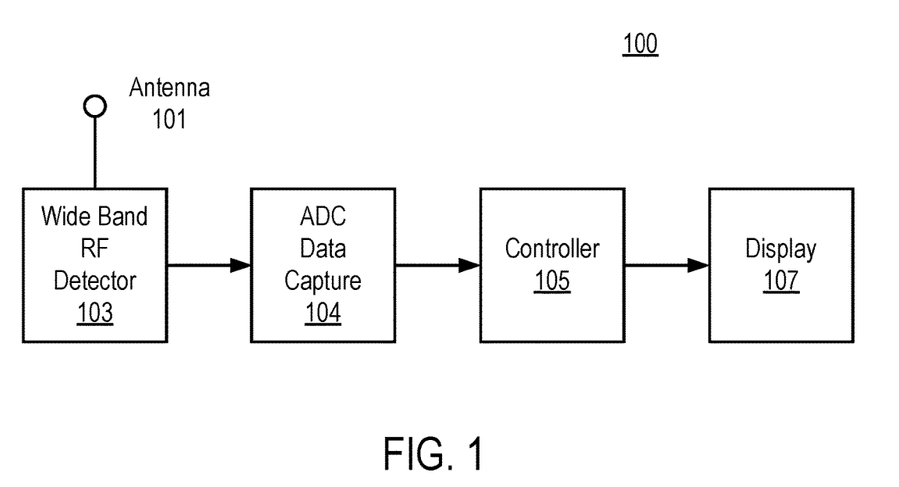
FIG. 1 is a block diagram of one embodiment of a handheld device.

In one embodiment, the energy apparatus comprises a portable handheld device which can be used for site optimization. FIG. 1 is a block diagram of one embodiment of handheld device 100. Referring to FIG. 1, handheld device 100 comprises a single omnidirectional antenna 101. Antenna 101 can be directional as well but this limits the type of energy that can be measured, based on orientation of the device. Multiple antennas can be used as well, but they will not necessarily improve accuracy, and they will add size, cost, and weight to the device.

A wideband radio frequency detector (e.g., LogAmp) 103 is coupled to measure the RF energy received by antenna 101 and generates an analog output such as an analog voltage or current. Analog-to-digital (ADC)/data capture device 104 converts the analog output to a digital value. Controller 105 receives the digital value from ADC data capture device 104. This value is a representation of the energy received at antenna 101. Controller 105 performs a mathematical interpolation of this value into a pre-defined mathematical function or a lookup table (this was generated during a controlled calibration step of the wideband radio frequency detector 103 in a manner well-known in the art and described later in FIG. 4) to convert the analog reading into an RF energy reading. Then controller 105 causes it to be displayed on display 107. The displayed digital value is a representation of the RF energy that is available to be captured for RF energy harvesting.

Figure 2:
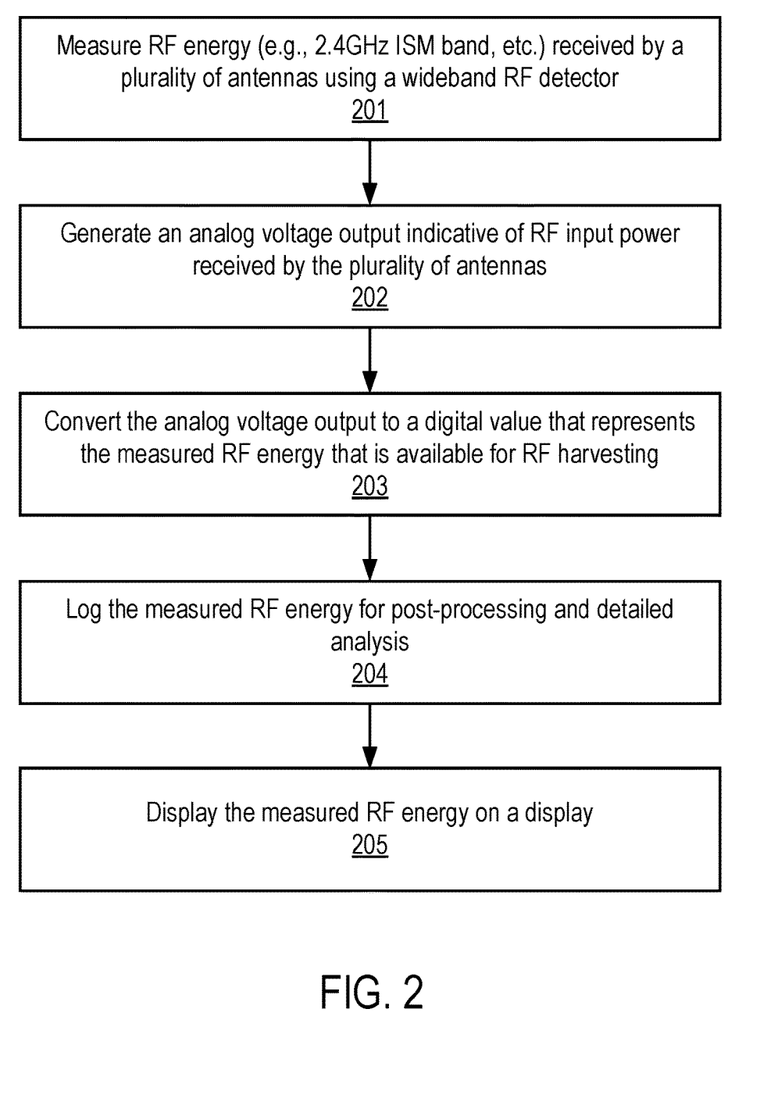
FIG. 2 is a flow diagram of one embodiment of an RF measuring process.

FIG. 2 is a flow diagram of one embodiment of an RF measuring process. The process is performed by processing logic that may comprise hardware (circuitry, dedicated logic, etc.), software (such as is run on a general purpose computer system or a dedicated machine), or a combination of both. In one embodiment, the process is performed by the hand-held device of FIG. 1. In another embodiment, the process is performed by a more detailed measurement system which may provide a plurality of antennas interconnected by a switch matrix and controlled by the system controller.

Referring to FIG. 2, the process begins by processing logic measuring RF energy in a specific frequency region (e.g., 2.4 GHz ISM band, etc.) received by a plurality of antennas using a wideband radio frequency detector (processing block 201). The plurality of antennas can be used to provide a more accurate and directional estimate of the RF energy available but a single directional or omnidirectional antenna can also be used. A switch matrix can be used to multiplex the antenna inputs into a single output (that switches between each antenna as controlled by the switch matrix controller). Next, processing logic generates an analog output indicative of RF input power received by the plurality of antennas (processing block 202) as fed through the switch matrix (or bypassing the switch matrix if only one antenna is used). Processing logic converts the analog voltage output to a digital value that represents the measured RF energy that is available for RF harvesting (processing block 203). This is based on a calibration stage that was performed with a known signal input from a signal generator, prior to actual data collection (as described later in FIG. 4). Processing logic stores the measured RF energy for post-processing and detailed analysis (processing block 204) then displays the measured RF energy on a display (processing block 205). This measured RF energy can be captured, stored, and averaged over time.

In another embodiment, the measurement apparatus simultaneously measures the total energy across the 2.4 GHz ISM band using different types of detectors and provides detailed measurements of the energy observed within the band. In one embodiment, analysis algorithms integrate the measurements across the band to determine the available RF power. If the measurements are from a frequency-specific device such as a spectrum analyzer, this integration is an average of the average measurements taken. Maximum values are not representative of the actual data available (they are too high and not typical).

In one embodiment, the ambient RF energy measurement apparatus includes multiple detectors employing multiple different measurement technologies (e.g., a wideband radio frequency detector, a LogAmp and a spectrum analyzer) and uses a correction factor generated based on RF measurements of at least one of the detectors to modify, correct, or reconcile with the measurement results of the other detector. The modified measurements is the measurement apparatus output.

Figure 3:
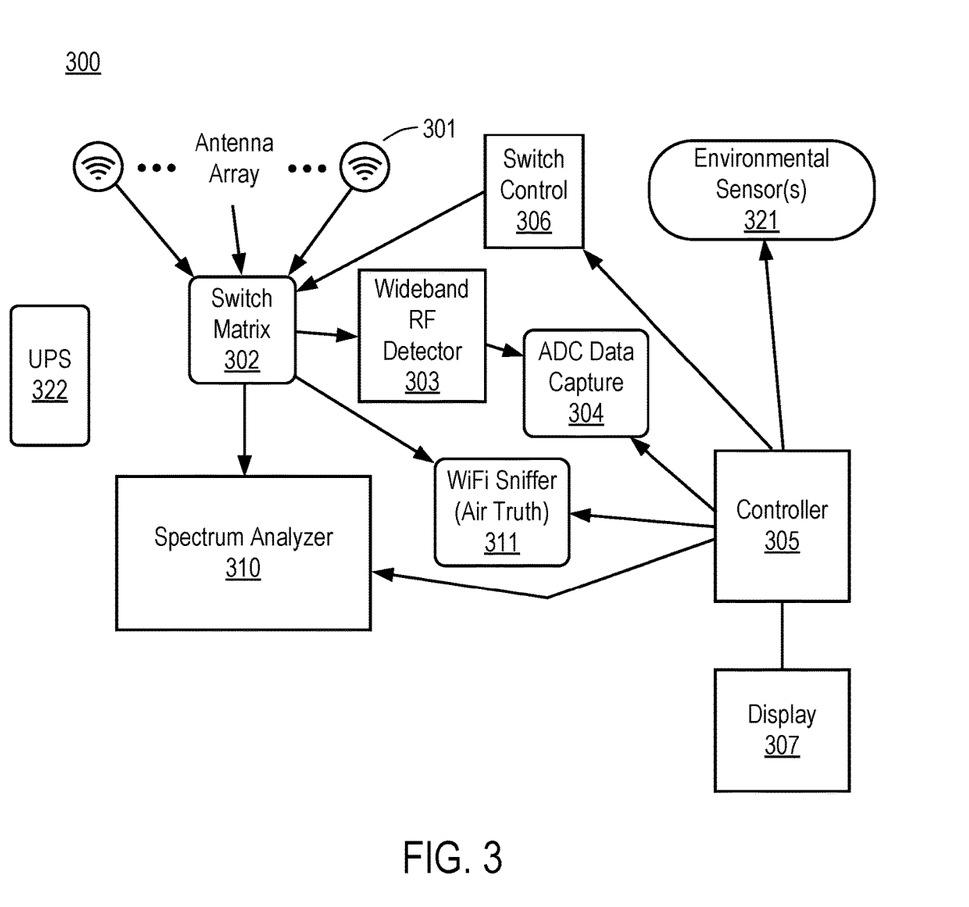
FIG. 3 illustrates one embodiment of an ambient RF energy measurement apparatus that uses multiple different detectors.

FIG. 3 illustrates one embodiment of an ambient RF energy measurement apparatus that uses multiple detectors. Referring to FIG. 3, system 300 comprises an antenna array 301 having multiple antennas. In one embodiment, antenna array 301 comprises 6 sixty-degree 2.4 GHz patch antennas arranged in horizontal polarization and 6 sixty-degree 2.4 GHz antennas arranged in vertical polarization. In one embodiment, antenna array 301 also comprises an optional 2.4 GHz omnidirectional antenna.

The output of antenna array 301 is coupled to switch matrix 302. Switch matrix 302 is controlled by switch control 306 to operate as a multiplexer. In one embodiment, switch matrix 302 comprises 15 switches that operate as a 16:1 RF multiplexer. In another embodiment, switch matrix 302 and switch control 306 are replaced with a RF multiplexer.

In one embodiment, system 300 includes an RF splitter at the output of the multiplexer to split the output of switch matrix 302 between a wideband radio frequency detector (e.g., LogAmp) 303 and spectrum analyzer 310. This enables both measurement devices to capture the same data at the same time. The output of the splitter can also connect Wi-Fi sniffer 311 to confirm the presence or lack of Wi-Fi traffic in the air while data is being captured. The splitter can also be a 3-way or more-way device. This RF splitter has not been shown to avoid obscuring the present invention.

Wideband radio frequency detector 303 performs an RF conversion on the output from switch matrix 302 and generates an analog output that is indicative of the RF energy being received by antenna array 301. In one embodiment, wideband radio frequency detector 303 comprises an ADL5513 logarithmic amplifier from Analog Devices. Analog-to-digital (ADC)/data capture device 304 converts the analog output to a digital value.

Spectrum analyzer 310 also performs an RF measurement on the output from switch matrix 302. In one embodiment, spectrum analyzer 310 comprises an Agilent N9320A RF Spectrum Analyzer, 9 KHz-3 GHz.

Controller 305 receives the digital value from ADC data capture device 104 as well as data from spectrum analyzer 310. Controller 305 first converts the digital value from the ADC data capture device 104 into an RF energy measurement. This is accomplished by either a lookup table or an interpolation of data captured with a known input source, created earlier during a calibration phase of the wideband radio frequency detector 303. Controller 305 also computes the average data from the spectrum analyzer datasets. This average is computed by summing all the energy measurement in a single trace sweep of the spectrum analyzer, and computing an average of that number across all sweeps recorded by the spectrum analyzer in the measurement apparatus. Also, note that a single sweep of the spectrum analyzer is composed of RF energy readings at specific frequencies within the sweep region—these individual samples are split into "bins". These "bins" can also be averaged across all sweeps, to obtain an average "sweep" of the spectrum analyzer across all frequencies in the spectrum analyzer sweep region. Controller 305 applies a correction factor obtained from wideband radio frequency detector 303 to spectrum analyzer 310, and path loss data obtained from calibration (described below), to generate an indication of the RF energy available for harvesting. Controller 305 sends this output (a single number) to be displayed on display 307. This same correction factor can be applied to the average "sweep" data, to obtain an accurate frequency-specific diagram of available RF energy at specific frequencies. The data can also be logged and stored by controller 305 in a database for follow-up analysis later.

In one embodiment, system 300 optionally includes Wi-Fi sniffer 311 in order to ensure validity of the data (i.e., confirm Wi-Fi data is present) being sampled by spectrum analyzer 310 and wideband radio frequency detector 303. This is optional.

In one embodiment, system 300 optionally includes one or more environmental sensors 321. These may include humidity, temperature, light, sound, etc. These can be used to correlate changes in measurement data with environmental factors.

In one embodiment, system 300 optionally includes an uninterruptable power supply (UPS) 322 or other type of battery, to supply power to the various components of system 300 without requiring the apparatus to always be plugged in.

Data Capture

Both spectrum analyzer 310 and wideband radio frequency detector 303 make RF measurements. In one embodiment, controller 305 performs post-processing required to combine the measurement data from both together into a more accurate measurement result.

Spectrum Analyzer

In one embodiment, spectrum analyzer 303 samples signals over a frequency range (e.g., from 9 KHz to 3 GHz) and measures power passing through a narrow-band filter (configurable to 1 MHz, 300 KHz, or 100 KHz, for example) into 461 (fixed number) bins, which are configured to spread across the Wi-Fi spectrum range (2.40-2.50 GHz). The power measured is stored into the units RAM (461 data points), and read by controller 305. In one embodiment, controller 305 reads the data after each sweep through the frequencies by spectrum analyzer 303.

Note that in one embodiment, because the sampling rate of spectrum analyzer 310 is much slower than the Wi-Fi traffic that is occurring (e.g., the Wi-Fi traffic is up to 1000× faster), bin-to-bin samples are still randomized with respect to the actual Wi-Fi packets being sampled. Thus, the bins are actually uncorrelated events. In other words, every sweep, and every bin sample within a single sweep, is an undersampled representation of the 2.4 GHz energy present at that particular instant in time, and therefore a random draw from a distribution of the energy available. Therefore, to ensure reliable readings by spectrum analyzer 310, in one embodiment, multiple datapoints are taken and averaged.

Also, regarding the bins, since the filtering is not perfect, as each bin is sampled by spectrum analyzer 310, energy from neighboring bins N−1 and N+1 will also likely be reported as energy in bin N. This means that spectrum analyzer 310 may report inflated aggregate power readings during numerical processing such as averaging or integration. Also with respect to a single bin, the same input frequency, at the left, center, or right of a bin, produce different amplitude measurements, but will all be reported in the same bin. Therefore, in one embodiment, the sample rate is chosen (e.g., 300 KHz RBW) for the measurements in order to blend the best of minimum sweep time and intra-bin variation, with closer-to-actual amplitude measurements.

These amplitudes, however, still need correction. The correction is based on a second measurement device, namely, wideband radio frequency detector 303.

Wideband Radio Frequency Detector (e.g., LogAmp)

Wideband radio frequency detector 303 receives RF energy and generates an output voltage. In one embodiment, the output voltage is given by:

$$V_{out} = K \log(V_{in}) + V_{offset}$$

where K is a constant factor. In one embodiment, K is measured in a calibration phase prior to using the wideband radio frequency detector for actual data collection, by generating data from a function generator or other known method of generating RF energy, and measuring the wideband radio frequency detector voltage output ($V_{out}$). In some embodiments, a measurement of the offset voltage $V_{offset}$ is made and included in the calibration phase. From these measurements a curve can be generated which shows the relationship of known RF energy input versus measured voltage output. From this, any other measured voltage out can be applied to the curve, and the RF input energy in can be interpolated from the curve. Thus, wideband radio frequency detector 303 generates a voltage output value, aggregated across the entire frequency band, for a particular RF input power. The output voltage value is digitized into a digital voltage value with ADC 304.

In one embodiment, controller 305 correlates wideband radio frequency detector data 303 to spectrum analyzer data 310 and constructs a correction factor to generate an output that indicates the RF energy available for harvesting. This is described in more detail below.

Controller Post-Processing

Once the data has been collected from the two measurement devices (i.e., wideband radio frequency detector 303 and spectrum analyzer 310), controller 305 performs post-processing on the data. In one embodiment, the post-processing combines all the spectrum analyzer data (samples and bins), with the wideband radio frequency detector data (series of measurements) into a single power number result for a particular measurement.

Computing the Average Power on the Spectrum Analyzer

The first goal of the measurement apparatus is to estimate the energy per hour (J/h) available in the 2.4 GHz Wi-Fi band. With the data captured, in one embodiment, controller 305 produces a measured power number for data captured from the spectrum analyzer.

In one embodiment, the process begins with a 2D array of power samples $\{P(f_i,t_j)\}$ collected from the spectrum analyzer (per antenna):

$\{P(f_i,t_j)\}$, in mW, where $\{t_j\}$ are sample times $1 \le i \le X$, $\{f_i\}$ are bin central frequencies $1 \le i \le Y$, and bin width is $df_{bin}$.

The spectral density is calculated according to the following equation:

$p_{sd}(f_i,t_j)=P(f_i,t_j)/F_{RBW}$, where $F_{RBW}$=resolution bandwidth configuration of the spectrum analyzer. Note that can be 1 MHz, 300 KHz, 100 KHz, or whatever resolution bandwidth is supported and used by the spectrum analyzer.

Using the calculated spectral density, the mean and max spectral densities are calculated over $t_j$ according to the following:

$p_{sd\ mean}(f_i)=(1/N_{samples}) \times \Sigma_{(j)} p_{sd}(f_i,t_j)$ $p_{sd\ max}(f_i)=\max_{(j)} p_{sd}(f_i,t_j)$ The post-processing can estimate an "average" duty cycle per bin according to the following:

$\text{DutyCycle}(f_i)=p_{sd\ mean}(f_i)/p_{sd\ max}(f_i)$.

Note that this is an optional processing step.

Based on data from spectrum analyzer 310, controller 305 calculates the total energy over time T is $E_{sa}(T)=T \times df_{bin} \times \Sigma_{(i)} p_{sd\ mean}(f_i)$.

Computing Correction Factor and Applying the Correction Factor to Spectrum Analyzer Data Controller 305 estimates a correction factor K to compensate for the inaccuracies of the bandpass filter F(RBW), used on typical measurement equipment, which comes from the resolution bandwidth on spectrum analyzer 310 (e.g., 1 MHz, 300 KHz, 100 KHz, etc.). To create the correction factor, controller 305 uses the data from wideband radio frequency detector 303.

In one embodiment, the data from wideband radio frequency detector 303 is a 1D array of voltage samples $\{V_{out}(t_m)\}$, $1 \le m \le Z$ samples, collected over the same time as spectrum analyzer data. The voltage sample set $\{V_{out}(t_m)\}$ is converted to input power $\{P_{in}(t_m)\}$ using a calibration function C, which is a linear interpolation formula combined with a lookup table $P_{in}(t_m)=C(V_{out})$. In one embodiment, the lookup table is generated as a calibration step on the wideband radio frequency detector. The calibration may need only be performed once on each wideband radio frequency detector, but it is required to be performed at least once for each wideband radio frequency detector due to manufacturing differences among radio frequency detectors. In some embodiments, it is necessary to perform a new calibration process when the temperature of the wideband radio frequency detector changes.

Controller 305 estimates the energy harvested over time T according to wideband radio frequency detector 303 as:

$E_{logamp}(T)=(T/\Sigma_{(m)} \Delta t_m) \times \Sigma_{(m)} p_{in}(t_m) \times \Delta t_m$.

Then, controller 305 estimates a constant correction factor K according to the following equation:

$K=E_{logamp}(T)/E_{sa}(T)$.

The correction factor K need only be generated at one time, when the unit is first calibrated. It should not drift that much over time, but can be re-calibrated as often as deemed necessary by the users. In addition, during the same calibration step used to measure and compute the correction factor K, the path loss can also optionally be measured. Path loss is relative measure of the amount of RF energy lost to the system, cabling, and measurement equipment, as the RF energy travels from the antenna array to the measurement devices (e.g., spectrum analyzer and wideband radio frequency detector). In one embodiment, the path loss may be measured using a network analyzer. In another embodiment the path loss may be measured using a procedure similar to the following:

1) Connect a signal generator (instead of an antenna) to the first input of the antenna switch matrix. Connect the spectrum analyzer at the output of the RF measurement chain (in the specific embodiment of FIG. 3, at the output of one channel of the RF splitter).

2) Generate a known signal with a known amplitude and frequency with the signal generator. Measure the amplitude on the spectrum analyzer, The difference between the original amplitude and the measured amplitude is the path loss.

3) Repeat Step 2 until all paths from all antenna array inputs have been calibrated.

4) Repeat Step 3 for all outputs of the splitter (because different paths through the splitter and different cables may have different path losses).

5) In general, the path loss will not vary much from path to path, so they can be averaged together to obtain one simple number to apply to all measurements ($K_{PathLoss}$). However, the user can also maintain separate path loss numbers and apply them individually to each data measurement.

Controller 305 applies the correction factor to any spectrum-analyzer-based energy estimates $E_{sa}(T)$ according to the following formula:

$$E_{corrected}(T) = K \times E_{sa}(T) \times K_{PathLoss}$$

The corrected energy estimate is used as the power measurement for a sample.

In summary, spectrum analyzer 310 is very narrow band with high spectral content, under-sampled, and due to the nature of the filters per bin, over-reporting the power available at any one frequency at any one point in time. Meanwhile wideband radio frequency detector 303 is very wideband, high sampling rate, but with very low spectral content information (only one datapoint per sample). Because of this, system 100 takes the spectrum analyzer bin over-averaging into account when post-analyzing the data. To do this, controller 305 uses wideband radio frequency detector 303, determines a correction factor K, and applies the correction factor to energy measurements of spectrum analyzer 310. With this process, accurate high spectral content data can be measured, captured, and accurately reported.

Figure 4:
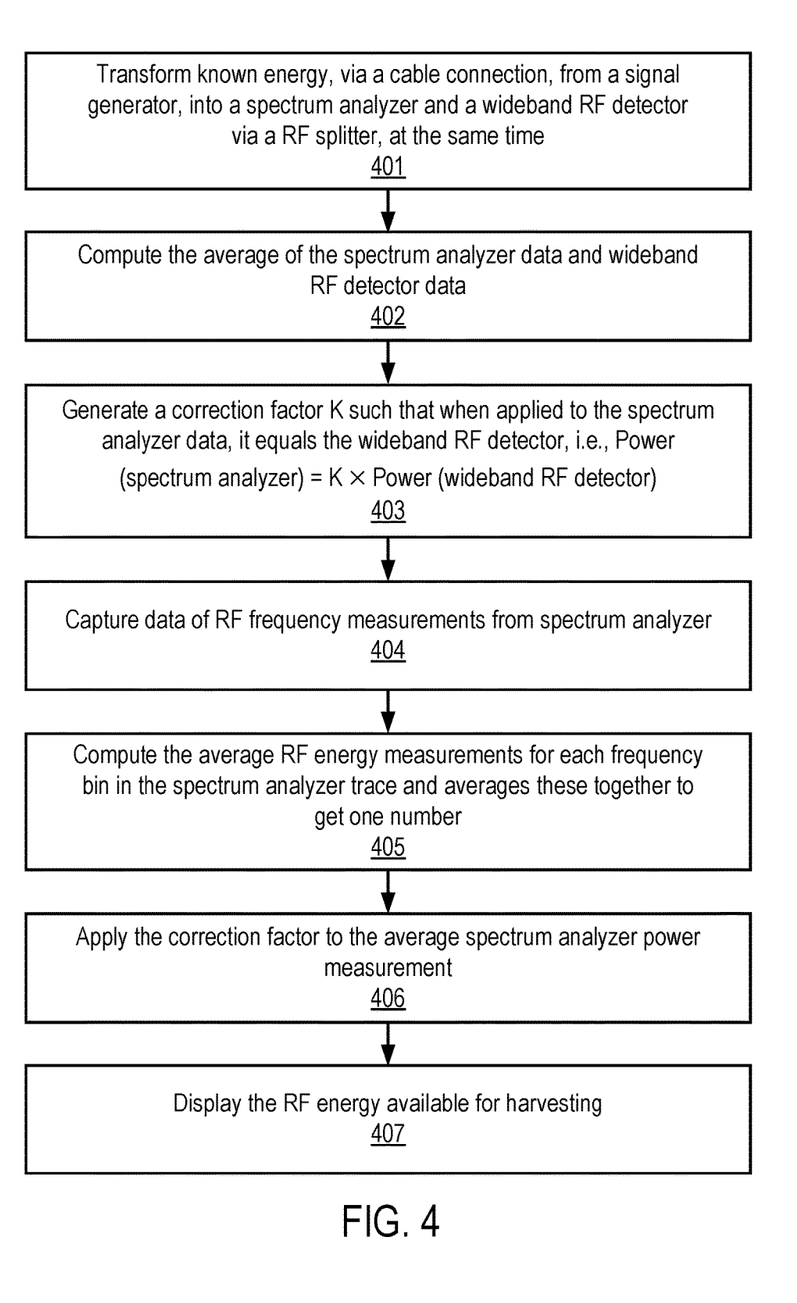
FIG. 4 is a flow diagram of one embodiment of a process for generating an indication of RF energy based on data from the spectrum analyzer and the wideband radio frequency detector.

FIG. 4 is a flow diagram of one embodiment of a process for generating an indication of RF energy based on data from the spectrum analyzer and the wideband radio frequency detector. The process is performed by processing logic that may comprise hardware (circuitry, dedicated logic, etc.), software (such as is run on a general purpose computer system or a dedicated machine), or a combination of both. In one embodiment, the process is performed by controller 305 of FIG. 3.

Referring to FIG. 4, the process begins by transforming known energy, via a cable connection, from a signal generator, into a spectrum analyzer and a wideband radio frequency detector via a RF splitter, at the same time (processing block 401). This is a preliminary calibration step. Next, processing logic computes the average of the spectrum analyzer data and wideband radio frequency detector data (processing block 402). Using this data, processing logic generates a correction factor K such that when applied to the spectrum analyzer data, it equals the wideband radio frequency detector data, i.e., Average Power (spectrum analyzer)=K×Average Power (wideband radio frequency detector)

Subsequently, processing logic captures data of RF frequency measurements from spectrum analyzer (processing block 404). Using the captured data, processing logic computes the average RF energy measurements for each frequency bin in the spectrum analyzer trace and averages these together to get one number (processing block 405). Then, processing logic applies the correction factor to the average spectrum analyzer power measurement (processing block 406). Furthermore, the individual bins of the spectrum analyzer trace sweeps can be averaged, but preserved to represent a single sweep trace which is the average of all the individual sweep traces. The correction factor K can be applied to each of these individual bin averages, resulting in a corrected, accurate, detailed frequency plot of the available energy.

Lastly, processing logic displays the RF energy available for harvesting (processing block 407), either as a single number or as a corrected average frequency trace. This data may also be logged and saved in a database, collected and created over time, for more detailed analysis at a later time.

Shown above is a way to compute average power by averaging all the spectrum analyzer data (also wideband radio frequency detector data) into a single number, and applying a correction factor from the wideband radio frequency detector average to the spectrum analyzer average power. This is presented only as example but does not restrict the present invention to only this method of averaging. There are other ways to obtain average data from the spectrum analyzer measurements as well.

An Example of a Computer System

Figure 5:
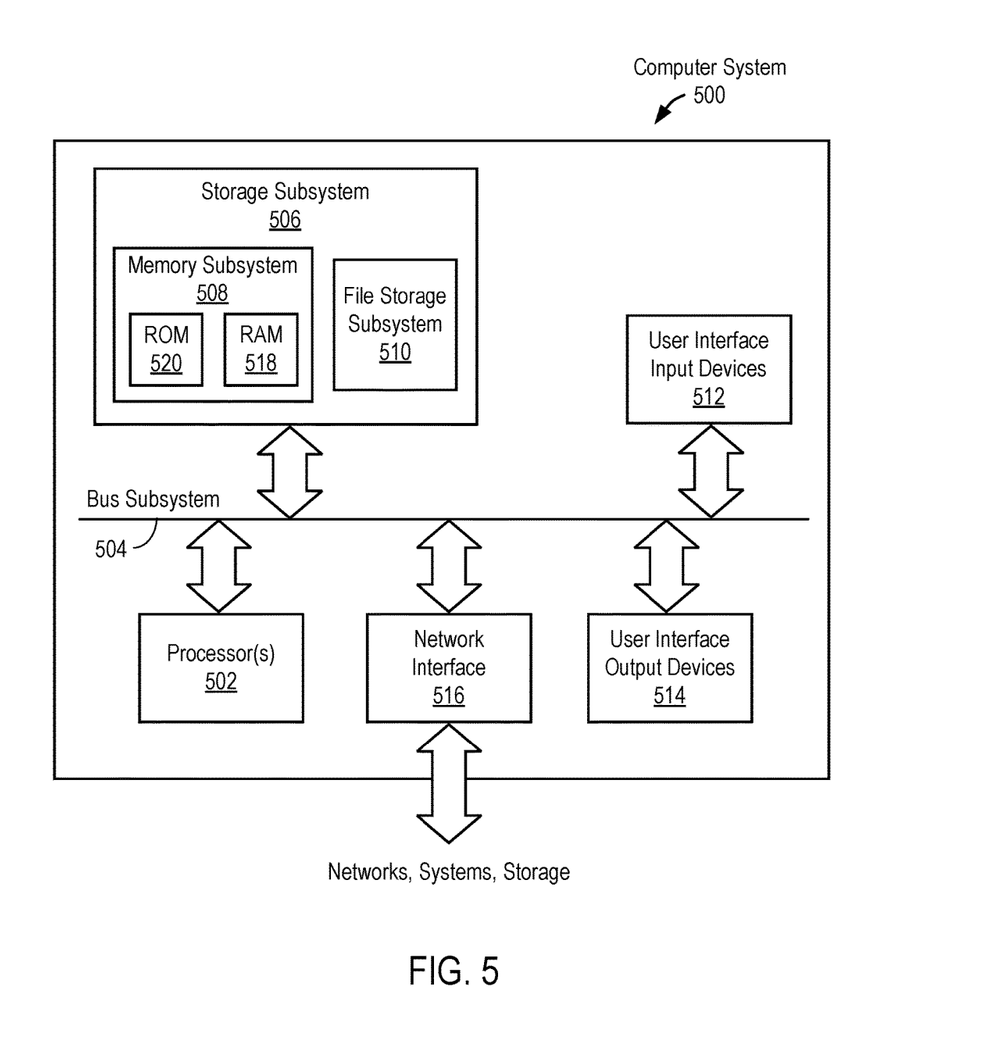
FIG. 5 is a block diagram of a computer system that may be used to practice an embodiment of the present invention.

FIG. 5 is a block diagram of a computer system 500 that may be used to practice an embodiment of the present invention. In one embodiment, computer system 500 may be used to implement controller 105 illustrated in FIG. 1 and/or controller 305 of FIG. 3 and described above. As shown in FIG. 5, computer system 500 includes a processor 502 that communicates with a number of peripheral subsystems via a bus subsystem 504. These peripheral subsystems may include a storage subsystem 506, comprising a memory subsystem 508 and a file storage subsystem 510, user interface input devices 512, user interface output devices 514, and a network interface subsystem 516.

Bus subsystem 504 provides a mechanism for enabling the various components and subsystems of computer system 500 to communicate with each other as intended. Although bus subsystem 504 is shown schematically as a single bus, alternative embodiments of the bus subsystem may utilize multiple busses.

Network interface subsystem 516 provides an interface to other computer systems, networks, and storage. Network interface subsystem 516 serves as an interface for receiving data from and transmitting data to other systems from computer system 500. For example, network interface subsystem 516 of system controller 101 may enable it to communicate with other systems via a communication network such as the Internet.

User interface input devices 512 may include a keyboard, pointing devices such as a mouse, trackball, touchpad, or graphics tablet, a scanner, a barcode scanner, a touch screen incorporated into the display, audio input devices such as voice recognition systems, microphones, and other types of input devices. In general, use of the term "input device" is intended to include all possible types of devices and mechanisms for inputting information to computer system 500.

User interface output devices 514 may include a display subsystem, a printer, a fax machine, or non-visual displays such as audio output devices, etc. The display subsystem may be a cathode ray tube (CRT), a flat-panel device such as a liquid crystal display (LCD), or a projection device. In general, use of the term "output device" is intended to include all possible types of devices and mechanisms for outputting information from computer system 500.

Storage subsystem 506 provides a computer-readable storage medium for storing the basic programming and data constructs that provide the functionality of the present invention. Software (programs, code modules, instructions) that when executed by a processor provide the functionality of the present invention may be stored in storage subsystem 506. These software modules or instructions may be executed by processor(s) 502. Storage subsystem 506 may also provide a repository for storing data used in accordance with the present invention. Storage subsystem 506 may comprise memory subsystem 508 and file/disk storage subsystem 510.

Memory subsystem 508 may include a number of memories including a main random access memory (RAM) 518 for storage of instructions and data during program execution and a read only memory (ROM) 520 in which fixed instructions are stored. File storage subsystem 510 provides a non-transitory persistent (non-volatile) storage for program and data files, and may include a hard disk drive, a floppy disk drive along with associated removable media, a Compact Disk Read Only Memory (CD-ROM) drive, an optical drive, removable media cartridges, and other like storage media.

Computer system 500 can be of various types including a personal computer, a phone, a portable computer, a workstation, a network computer, or any other data processing system. Due to the ever-changing nature of computers and networks, the description of computer system 500 depicted in FIG. 5 is intended only as a specific example for purposes of illustrating the preferred embodiment of the computer system. Many other configurations having more or fewer components than the system depicted in FIG. 5 are possible.

Although specific embodiments of the invention have been described, various modifications, alterations, alternative constructions, and equivalents are also encompassed within the scope of the invention. The teachings described above may be applied to any system comprising a processor that can be booted or rebooted. For example, while embodiments have been described above using certain systems as examples, this is not intended to be restrictive. The teachings described above and recited in the claims may also be practiced by other computing systems.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An ambient radio-frequency (RF) energy measurement apparatus for measuring energy available for RF harvesting at a particular location, the apparatus comprising:
    a plurality of antennas;
    at least one wideband radio frequency detector coupled to the plurality of antennas to measure ambient RF energy, wherein each wideband radio frequency detector has an analog output indicative of RF input power received by the plurality of antennas;
    at least one analog-to-digital converter coupled to each wideband radio frequency detector to convert the analog output to a digital value;
    a spectrum analyzer coupled to the plurality of antennas through an RF multiplexer to perform an RF frequency measurement;
    a Wi-Fi sniffer to confirm presence of Wi-Fi traffic within data measured by the spectrum analyzer and the at least one wideband radio frequency detector; and
    a controller coupled to the spectrum analyzer and the at least one wideband radio frequency detector to generate an output indicative of ambient RF energy available for RF harvesting based on data from the spectrum analyzer and the at least one wideband radio frequency detector,
    wherein each digital value is applied to a calibration function to provide a number representing RF energy available at a particular location.

2. The measurement apparatus defined in claim 1 wherein the at least one wideband radio frequency detector and the spectrum analyzer simultaneously measure the total energy across a band, and further wherein the controller integrates measurements across the band to determine the RF power available.

3. The measurement apparatus defined in claim 1 wherein the controller correlates wideband radio frequency detector energy measurement data with measurement data from the spectrum analyzer.

4. The measurement apparatus defined in claim 1 wherein the controller is operable to:
    compute average power based on the spectrum analyzer data;
    compute a correction factor based on the data from the at least one wideband radio frequency detector;
    compute an insertion loss between the antennas and the measurement equipment for each RF path through the apparatus;
    apply the correction factor and insertion loss to the spectrum analyzer average power to adjust to average power, the adjusted average power representing the RF energy available for harvesting.

5. The measurement apparatus defined in claim 4 wherein the controller computes the correction factor by:
    converting wideband radio frequency detector power data; and
    correlating wideband radio frequency detector power data to the data from the spectrum analyzer.

6. The measurement apparatus defined in claim 1 wherein the spectrum analyzer measures power in a plurality of frequencies spread across the Wi-Fi spectrum range, and further wherein the controller reads power measured by the spectrum analyzer through frequencies associated with the plurality of frequencies and averages multiple readings to determine average power.

7. The measurement apparatus defined in claim 1 further comprising:
    a multiplexer having a plurality of inputs and an output, each of the plurality of outputs coupled to one antenna in the plurality of antennas; and
    an RF splitter coupled to the output of the multiplexer, and having a first output coupled to an input of the spectrum analyzer and a second output coupled to an input of the at least one wideband radio frequency detector.

8. The measurement apparatus defined in claim 7 wherein the multiplexer comprises a plurality of RF switches operable together to perform a n:1 RF multiplexer, and a switch controller coupled to the plurality of n switches to control the output of the switch matrix so that only one switch produces an output at a time.

9. The measurement apparatus defined in claim 1 wherein the plurality of antennas comprises a plurality of linearly polarized antennas, wherein antennas of a first group of the plurality of antennas are horizontally polarized and antennas of a second group are vertically polarized.

10. The measurement apparatus defined in claim 1 wherein the plurality of antennas, the at least one wideband radio frequency detector and the analog-to-digital converter are contained in a hand-held portable device.

11. The measurement apparatus defined in claim 1 wherein the RF energy comprises Wi-Fi energy.

12. A method for processing radio-frequency (RF) energy to determine RF energy available for RF harvesting, the method comprising:
    confirming, by a Wi-Fi sniffer, presence of Wi-Fi traffic within data measured by a spectrum analyzer and at least one wideband radio frequency detector, the spectrum analyzer to make RF frequency measurements;
    measuring RF energy using the at least one wideband radio frequency detector coupled to a plurality of antennas;

generating an analog output indicative of RF input power received by the plurality of antennas;
converting the analog output to a digital value; and
applying the digital value to a calibration function to obtain a number representing RF energy.

13. The method apparatus defined in claim 12 further comprising:
obtaining an RF frequency measurement from the spectrum analyzer; and
generating an output indicative of ambient RF energy available for RF harvesting based on the digital value from the at least one wideband radio frequency detector and data from the spectrum analyzer.

14. The method defined in claim 13 further comprising:
computing average power based on RF frequency measurements from the spectrum analyzer;
computing a correction factor based on digital values generated based on the data from the at least one wideband radio frequency detector;
measuring the insertion loss between the antennas and the measurement equipment for each RF path through the apparatus;
applying the correction factor and insertion loss to the average power to adjust to average power, the adjusted average power representing the RF energy available for harvesting.

15. The method defined in claim 14 wherein computing the correction factor comprises:
converting wideband radio frequency detector power data; and
correlating wideband radio frequency detector power data to data from the spectrum analyzer.

16. The method defined in claim 12 wherein the RF energy comprises Wi-Fi energy.

* * * * *